ID1736026605155

United States Patent [19]
Andrews

[11] Patent Number: 5,422,905
[45] Date of Patent: Jun. 6, 1995

[54] CLOSELY SPACED DUAL DIODE LASERS

[75] Inventor: John R. Andrews, Fairport, N.Y.

[73] Assignee: Xerox Corporation, Stamford, Conn.

[21] Appl. No.: 262,794

[22] Filed: Jun. 20, 1994

Related U.S. Application Data

[62] Division of Ser. No. 057,799, May 7, 1993, Pat. No. 5,360,761.

[51] Int. Cl.⁶ .................... H01S 3/025; H01S 3/043
[52] U.S. Cl. ........................... 372/50; 372/45; 372/97; 372/36
[58] Field of Search .............. 372/23, 50, 36, 97, 372/43, 44; 369/122, 44.37

[56] References Cited

U.S. PATENT DOCUMENTS

| | | | |
|---|---|---|---|
| 4,403,243 | 9/1983 | Hakamada | 357/74 |
| 4,419,013 | 12/1983 | Heimer | 356/400 |
| 4,796,964 | 1/1989 | Connell et al. | 350/6.9 |
| 4,870,652 | 9/1989 | Thornton | 372/50 |
| 4,901,325 | 2/1990 | Kato et al. | 372/44 |
| 4,999,077 | 3/1991 | Drake et al. | 156/299 |
| 5,086,431 | 2/1992 | Hardy, Jr. et al. | 372/36 |
| 5,099,488 | 3/1992 | Ahrabi et al. | 372/36 |
| 5,105,255 | 4/1992 | Shanon et al. | 437/924 |
| 5,283,205 | 2/1994 | Sakamoto | 437/924 |

Primary Examiner—Rodney B. Bovernick
Assistant Examiner—Robert McNutt
Attorney, Agent, or Firm—Duane C. Basch

[57] ABSTRACT

The present invention is directed to a method and apparatus for fabricating a dual beam semiconductor laser, wherein the laser includes first and second semiconductor laser dies respectively affixed to one another while separated by intervening alignment structures. The alignment structures provide accurate placement of the dual laser beams with respect to one another while also assuring thermal isolation of the laser diodes. The fabrication method employs photolithographic techniques to accurately position the alignment structures across an entire semiconductor wafer, thereby assuring accuracy in alignment of the assembled dual beam lasers. As a result, the need for multiple-step alignment operations commonly employed in the production of multiple diode laser devices is eliminated.

6 Claims, 6 Drawing Sheets

CLOSELY SPACED DUAL DIODE LASERS

This is a division of application Ser. No. 08/057,799, filed May 7, 1993, now U.S. Pat. No. 5,360,761.

This invention relates generally to a semiconductor laser device, and more particularly to a method for precisely fabricating a dual diode laser from a pair of single spot semiconductor laser chips.

BACKGROUND AND SUMMARY OF THE INVENTION

The present invention is directed to a method for producing a semiconductor laser device having a pair of closely spaced semiconductor lasers in order to achieve interlaser spacings of approximately 2 $\mu$m. Such a device may be incorporated in numerous devices including optical disk readers or flying spot scanners (commonly referred to as raster output scanners (ROSs)). A flying spot scanner typically has a reflective multifaceted polygon mirror that is rotated about its central axis to repeatedly sweep one or more intensity modulated beams of light across a photosensitive recording medium in a linear or fast-scanning direction. Printers employing multiple intensity-modulated beams are referred to as multibeam or multispot printers. In such printers the dual lasers are considered to be an enabling technology for high speed operation at resolutions of about 600 spots per inch (spi). The present invention utilizes integrated alignment devices which are formed on the surfaces of the semiconductor wafers from which the laser diode dies are produced to accurately position a pair of laser dies with respect to one another. Furthermore, a small air space generally separating the two laser dies provides thermal, electrical and optical isolation therebetween.

The desirability of a multiple beam semiconductor laser has been recognized previously. However, because of thermal crosstalk between closely spaced laser diodes, practical interlaser spacings have generally been limited to spacings of at least 100 $\mu$m. Designs intended to achieve close spacing of the emitted laser beams are known, of which the following disclosures which may be relevant:

Kato et al., U.S. Pat. No. 4,901,325, issued Feb. 13, 1990

Thornton U.S. Pat. No. 4,870,652, issued Sep. 26, 1989

Connell et al., U.S. Pat. No. 4,796,964, issued Jan. 10, 1989

Hakamada, U.S. Pat. No. 4,403,243, issued Sep. 6, 1983

The relevant portions of the foregoing patents, hereby incorporated by reference for their teaching, may be briefly summarized as follows:

U.S. Pat. No. 4,901,325 teaches a semiconductor laser device used in an optical disk device which utilizes a pair of semiconductor laser chips and a fixing device for fixing the laser chips so that the electrode surfaces are approximately parallel and opposite to each other. The fixing device comprises either a single-piece, U-shaped block or, alternatively, a pair of blocks, upon which the photodiodes are ultimately mounted. When a pair of blocks are used, a tooling system (see FIG. 9) is used to align and permanently affix the blocks to a base plate under the control of a vision system which enlarges and processes an image region centered on the active regions of the lasers affixed thereto.

U.S. Pat. No. 4,870,652, discloses a monolithic high density array of independently addressable semiconductor lasers. The lasers are further characterized as having emitters on closely spaced, 3–10 $\mu$m, centers, without displaying phase locking and with minimal crosstalk effects. The monolithic, independently addressable array is suitable for use with high speed laser printers, laser disk technology, and fiber optic communication.

U.S. Pat. No. 4,796,964 describes a method for using a multiple emitter solid state semiconductor laser in a raster output scanner. The overlapping beams are sequenced in ON/OFF operation to avoid any inter-beam interference in a manner that assures that only one laser beam will be on at any given time. Hence, nonuniformity caused by optical interference of overlapping beams is prevented without the need for further modification of the optical properties of the beams (e.g., polarization and wavelength).

U.S. Pat. No. 4,403,243 teaches a laser apparatus including support and soldering means for a light transmitting member which is affixed so as to allow transmission of an emitted laser beam generated within the apparatus by a semiconductor laser. The light transmitting, by soldering, becomes hermetically sealed to a support member, thereby completely encapsulating the laser source.

In accordance with the present invention, there is provided a method of fabricating a dual beam semiconductor laser, including the steps of:

forming a pair of laser dies with one of the laser dies having an alignment member on a surface thereof and the other of the laser dies having a complementary alignment member on a surface thereof; and assembling the pair of laser dies with the alignment members on each of the laser dies mating with one another so as to space opposed surfaces of the laser dies from one another and align the dual beam semiconductor laser.

In accordance with another aspect of the present invention, there is provided a dual beam laser diode comprising a first laser die including a light emitting region; a second laser die including a light emitting region; and means, interposed between said first laser die and said second laser die, for spacing said first laser die from said second laser die and aligning the respective light emitting regions thereof.

In accordance with yet another aspect of the present invention, there is provided a dual beam laser diode prepared by a process comprising the steps of:

producing a plurality of laser dies on a semiconductor wafer, said laser dies each including a p-n junction lying beneath a first surface of the wafer and above a substrate layer which establishes a second surface, and a first metal layer on the first surface of the wafer, thereby providing electrical contacts for the laser dies;

depositing a spacer material layer over the first metal layer on the first surface of the wafer;

selectively removing portions of the spacer material so as to produce complimentary alignment structures on the first surface of each laser die;

depositing a second metal layer so as to metalize the surfaces of the alignment structures present on the first surface;

dividing the semiconductor wafer into individual laser dies; and assembling a first die and a second die, with the first surfaces of both dies spaced apart from one another by the complimentary alignment structures, so that the alignment structures on the first die mate with complimentary alignment structures on the second die, thereby aligning the dual beam semiconductor laser.

The present invention will be described in connection with a preferred embodiment, however, it will be understood that there is no intent to limit the invention to the embodiment described. On the contrary, the intent is to cover all alternatives, modifications, and equivalents as may be included within the spirit and scope of the invention as defined by the appended claims.

DESCRIPTION OF THE PREFERRED EMBODIMENT

Figure 1:
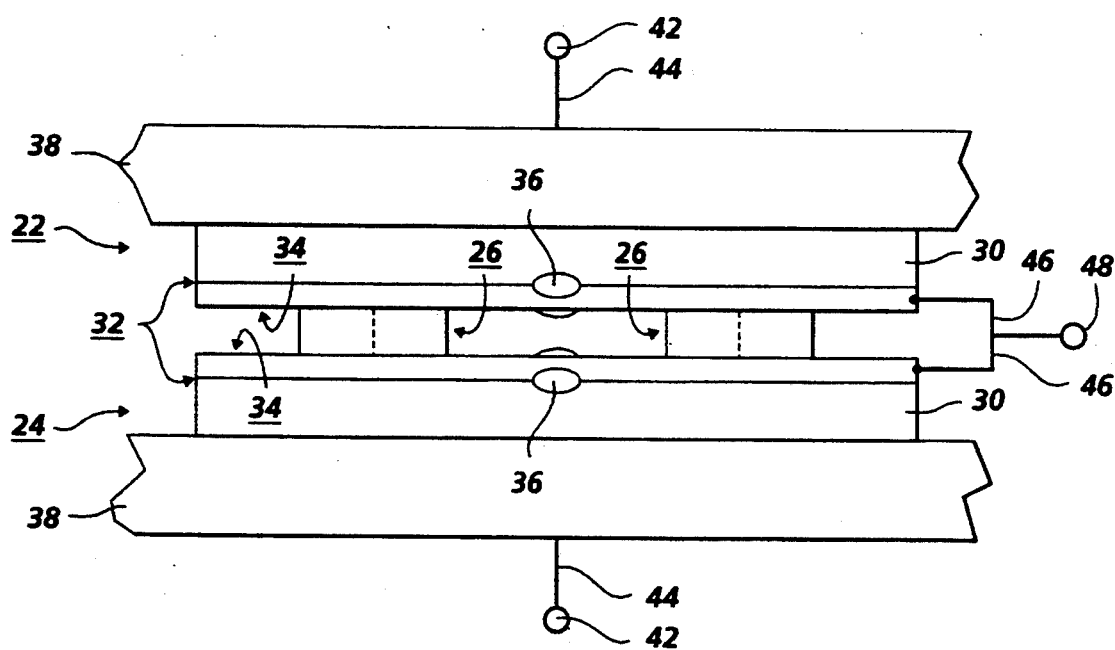
FIG. 1 is a schematic elevational view of the dual beam laser diode as it would appear fully assembled.

For a general understanding of the method of assembling dual beam semiconductor lasers in accordance with the present invention, reference is made to the drawings. In the drawings, like reference numerals have been used throughout to designate identical elements. FIG. 1 shows a schematic view of the dual beam laser diode as it would appear fully assembled, wherein the viewing direction is parallel to the path of the dual laser beams emitted by the assembly.

More specifically, FIG. 1 illustrates a closely spaced dual beam semiconductor laser, preferably formed using alignment structures or members which will be described hereafter. Dual beam laser 20 generally includes a pair of semiconductor laser devices or dies, 22 and 24, which are permanently affixed to one another via spacer members 26 interspaced therebetween and which also serve as alignment structures. Each laser die, 22 and 24, is comprised of multiple epitaxial layers deposited upon a semiconductor wafer. Moreover, each laser die may be characterized as including a substrate layer 30, and a p-n junction 32. The p-n junction is located beneath the surface 34, also referred to as the junction side or surface of the laser die, at a distance of about less than 1 $\mu$m. The p-n junction further defines the center of the light emitting region 36 in the vertical direction, as displayed in FIG. 1.

Heatsinks 38 are also rigidly affixed to the substrate layer side of each laser die. Heatsinks 38 may be formed from copper or other heat conducting materials such as metalized beryllia (BeO), silicon, and diamond. During operation of the dual beam laser diode, the heatsinks serve not only to dissipate thermal energy generated by the laser dies, but also as electrical contacts to the substrate layers via electrical contacts 42 and conductors 44. On the opposite side of the laser dies, connected to a metalized layer deposited on the junction side of the die, are a second set of electrical conductors, illustrated schematically by reference numeral 46, which in turn are connected to a common electrical ground via contact point 48. While not specifically shown, it is understood that the dual beam assembly would further include a base plate or similar mounting platform to which the heatsinks would be permanently affixed by a soldering or brazing technique, thereby securing the entire assembly in the closely spaced configuration depicted in FIG. 1. It is further understood that the base plate would also include electrically insulated feedthroughs which would provide power to the laser dies via the electrical contacts. Once the previously described elements are assembled a cap, including a transparent window, would be placed over the elements and sealed to the base plate to encapsulate the dual beam laser assembly.

Figure 3:
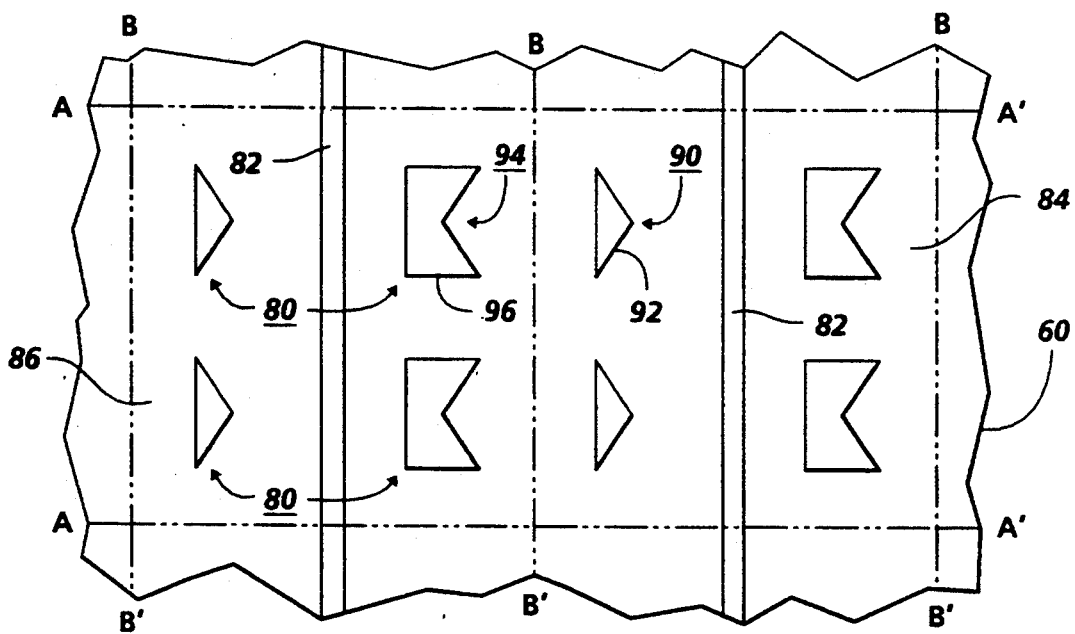
FIG. 3 is a planar view illustrating the appearance of the junction side of the semiconductor subsequent to the processing steps of FIGS. 2A–2D.

Referring now to FIGS. 2A–2D in conjunction with FIG. 3, where the processing steps used to produce and assemble the present invention are further illustrated, a commonly known process for producing a semiconductor laser die is used to prepare the semiconductor wafer 60. More specifically, a semiconductor laser wafer is produced having multiple epitaxial layers 62 on a semiconductor substrate 64, thereby defining a p-n junction 66. Wafers prepared in accordance with these requirements are commonly available. The p-n junction defines the center of the light emitting region that is spaced a distance beneath the upper surface of the wafer by a distance in the range of about 0.1 $\mu$m to about 2.0 $\mu$m, and preferably less than approximately 1 $\mu$m. The distance by which the p-n junction lies beneath the upper surface of the wafer depicted in the figures directly impacts the beam separation distance of the dual beam laser once assembled. Furthermore, the thicknesses of the epitaxial layers that lie over the p-n junction are controllable to less than about 1 percent of the layer thicknesses, thereby enabling accurate control of the beam separation distance.

Following the epitaxial layer growth, ohmic contacts 66 are formed on the wafer surface. The ohmic contacts, which are typically formed by an evaporated gold alloy, are deposited by standard processes used in the wafer fabrication industry.

Figure 2A:
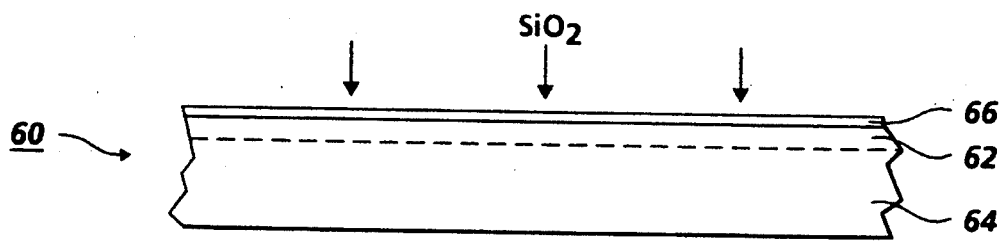
FIGS. 2A–2D are elevational views depicting a portion of a semiconductor wafer in various stages of processing pursuant to the present invention.
Figure 2B:
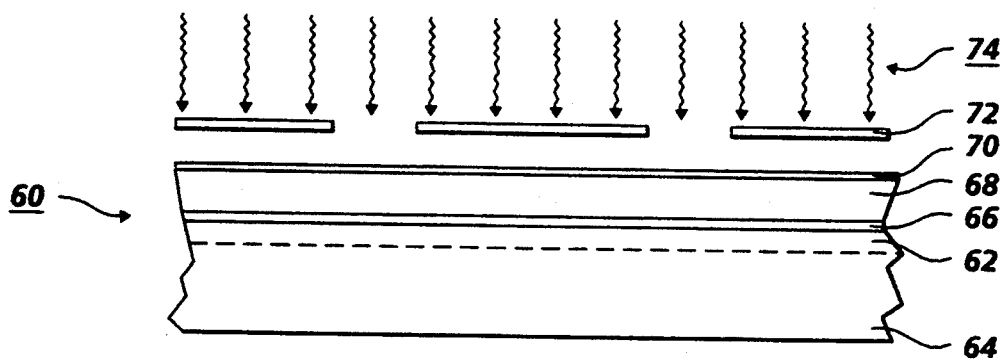
Figure 2C:
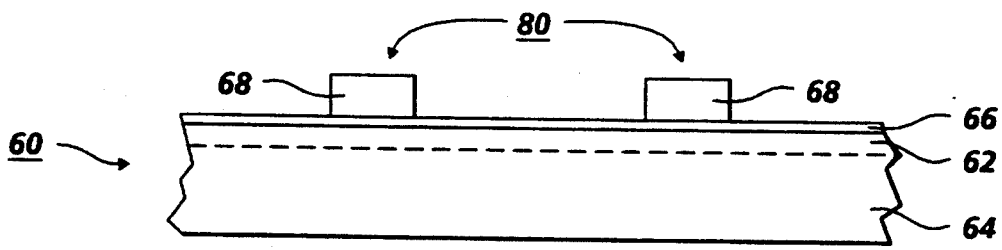

Normally such a wafer would then be diced into a linear array or bar of laser dies and the bars then cleaved into individual laser dies. However, for the dual beam laser apparatus described herein, several additional wafer processing steps facilitate mass production and close alignment of the resulting dual lasers. More specifically, as illustrated beginning with FIG. 2A, on the metalized junction side of the wafer, a spacer layer of a low thermal conductivity material 68, preferably SiO$_2$ or Si$_3$N$_4$, is vacuum deposited. Alternatively, other materials such as spincoated photoresist or polyimide may be used for the spacer layer. The spacer layer can typically be created with a thickness accuracy of less than approximately 1 percent, enabling the accurate control of the separation distance between the mating laser dies as illustrated in FIG. 1. The thickness of spacer layer 68 may be varied, however, it is preferably maintained at a thickness of about 3 $\mu$m, thus minimizing the separation between the laser beams while allowing for sufficient separation to assure thermal isolation between the lasers. Subsequently, using a commonly known photoresist patterning technique represented in FIG. 2B, a photoresist mask layer 70 is applied and optically exposed to a patterned mask 72 via light source 74 to expose alignment patterns on the photoresist. The photoresist patterning step enables subsequent etching of the low thermal conductivity spacer layer 68 in the areas unprotected by the photoresist to produce alignment members 80 therefrom, as shown by FIG. 2C.

Since the lithographic processes used to form the laser dies is carried out on the junction side of wafer 60, the alignment members produced by the same techniques may be aligned laterally to within tolerances on the scale of tenths of a micron with respect to the laser stripes 82, which define the lateral position of the light emitting region 36 of FIG. 1. As an alternative to the above-described steps, the alignment members may be produced using the process described by Drake et al. in U.S. Pat. No. 4,999,077 (Issued Mar. 12, 1991), which is hereby incorporated by reference for its teachings.

Figure 2D:
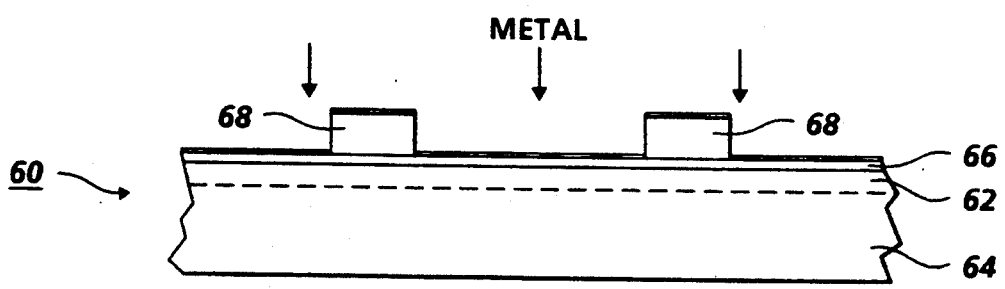

As illustrated in FIG. 2D, after the alignment members are produced, a second metalized layer is applied over the members to permit subsequent joining of the two lasers and associated alignment members, during a soldering stage and to assure common electrical contact therebetween. As a further processing option, the soldering stage would be facilitated if a suitable high temperature solder layer such as Au-Sn were deposited over the second metalization layer.

The processed wafer would then be ready for dicing into bars along lines A—A' and cleaved along lines B—B' as shown in FIG. 3. A commonly known scribing operation is used to determine the cleave location in formation of the laser dies and generally has a placement accuracy of about 1 μm. Therefore, the laser facets on the face of laser dies could be placed to this accuracy with respect to the previously produced alignment members 80. After the wafer is diced into bars, or linear arrays of laser dies, one of two alternative processes could be followed. In the first alternative, the dual laser diodes could be formed by dicing one bar at a time, mating two bars of laser dies back-to-back, and then cleaving the bars into individual dual diode laser segments for subsequent mounting on heatsinks. As the second alternative, the bars could be cleaved into individual laser dies, the dies mounted on heatsinks 38, and then the two premounted individual lasers aligned and coupled in the back-to-back manner illustrated in FIG. 4. Electrical contact could be provided to the junction side of the laser dies by placing a thin gold or similar malleable wire between the two laser dies before assembly of the dual laser. The wire would deform and provide a pressure contact for the common connection. Alternatively, electrical contact could be provided to the metalized junction side of the laser dies by a commonly known wirebonding operation as described hereafter.

Figure 4:
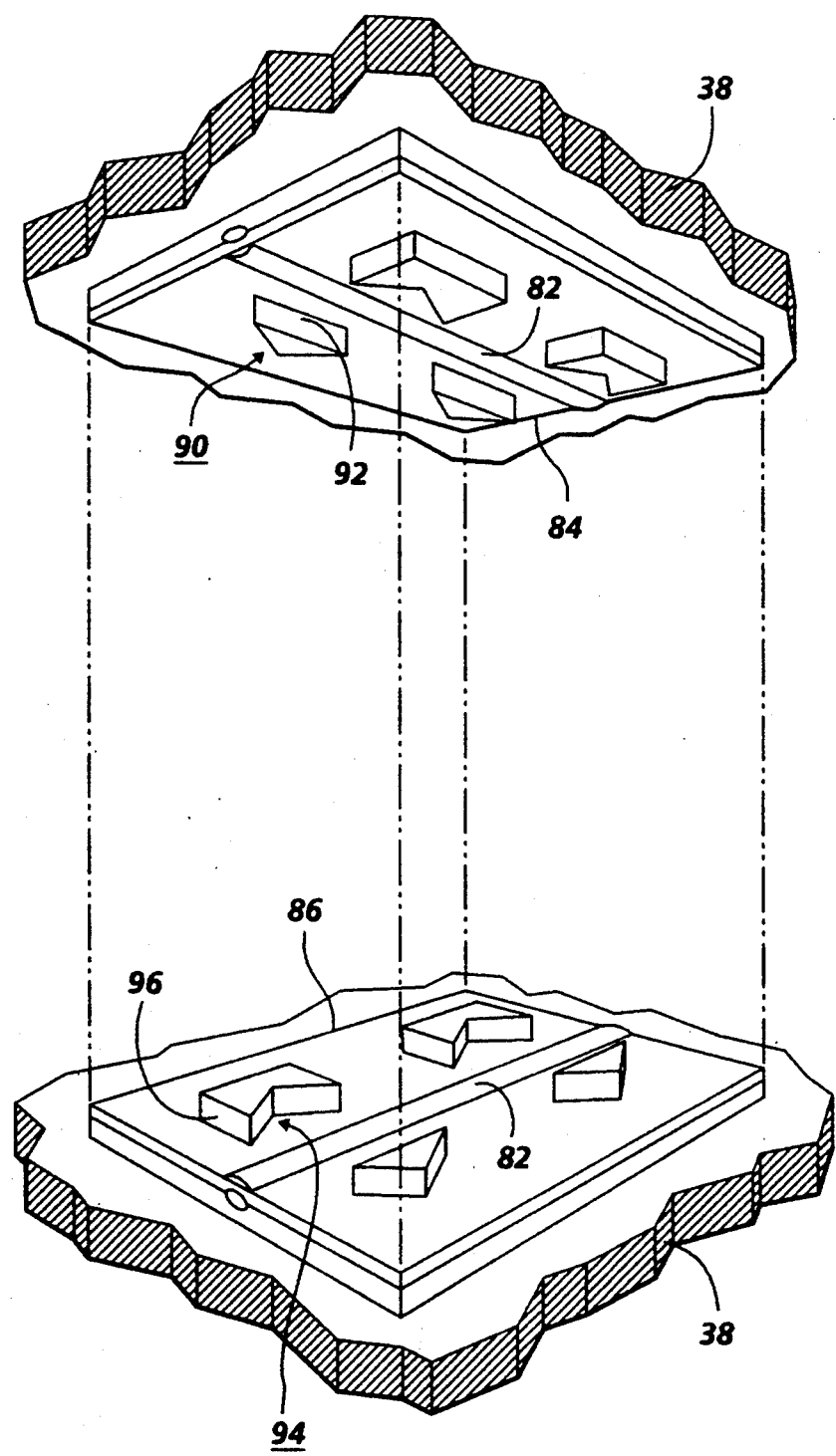
FIG. 4 is a perspective view showing the manner in which a pair of laser dies are assembled to produce the dual beam laser diode of the present invention.
Figure 5:
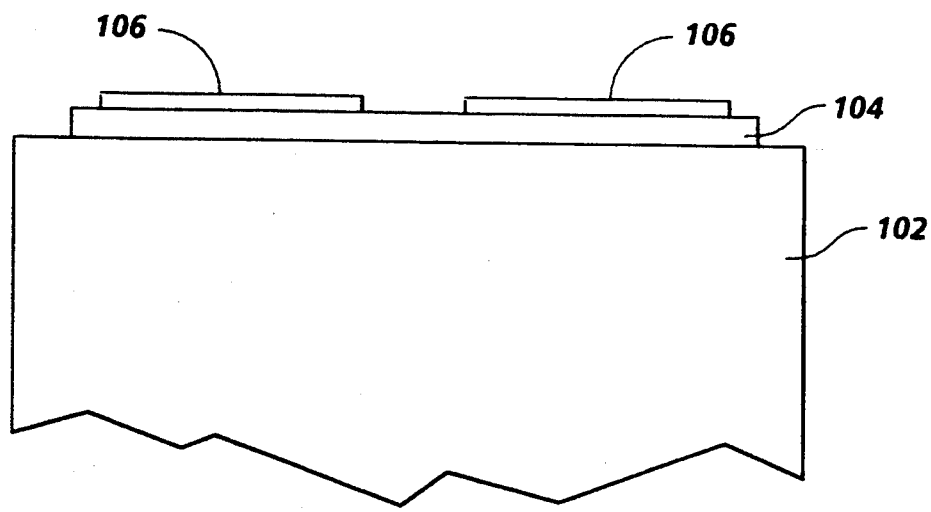
FIGS. 5 through 8 are elevational views illustrating various stages of assembly of an optoelectronic assembly employing the dual beam laser diode of FIG. 1.
Figure 9:
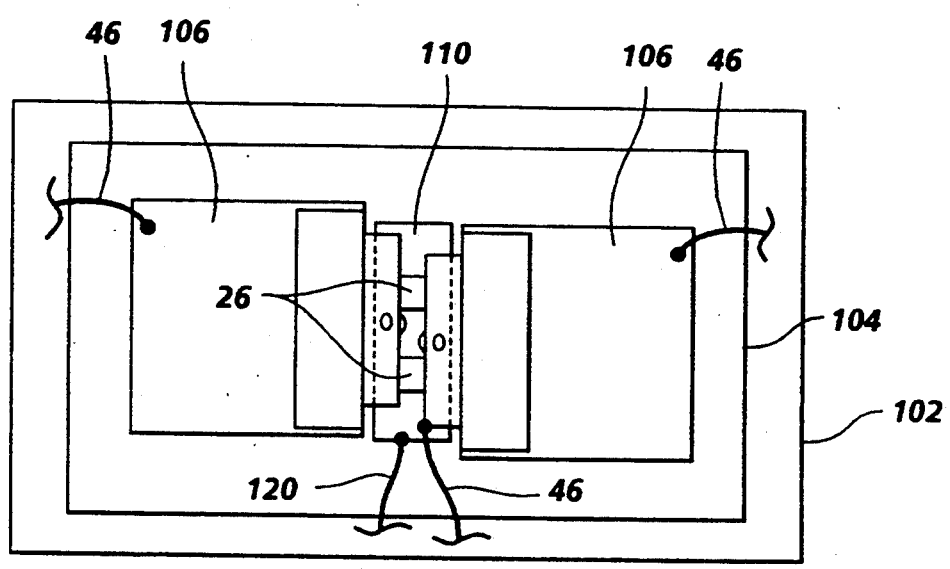
FIG. 9 is a planar view of the final assembly of FIG. 8.

Referring again to FIG. 3, where two adjacent laser dies having alignment members 80 are shown in wafer 60, the complimentary nature of the alignment members can be appreciated. Referring also to FIG. 4, when first laser die 84 is separated from second laser die 86 and then turned over onto the surface of the second laser die, the alignment features will lock together to bring the laser stripes into registration as illustrated in FIG. 1, or a predetermined offset as illustrated in FIG. 9, as the two laser dies are assembled in accordance with FIG. 4. As an example, because the alignment members compliment one another, the front portion 90 of alignment member 92 will accurately mate with the conversely formed portion 94 of complimentary alignment member 96. Also to be noted is the possibility of similar complimentary shaped alignment members and the respective geometrical spacing of such members on the surface of the wafer, for example the key shapes disclosed by Drake et al. in U.S. Pat. No. 4,999,077, the relevant portions thereof having been previously incorporated herein by reference.

Once a pair of laser dies is assembled by the foregoing process, described with respect to FIG. 4, the assembled pair must be further assembled into a larger optoelectronic package. In assembling the optoelectronic package including dual beam laser 20, it would also be necessary to place a suitable photodiode in the assembly in a manner suitable for sensing emissions from the rear of the lasers when energized. For example, such a photodiode would be formed, perhaps in adjacent pairs, in a silicon wafer using standard processes. Subsequently, the back side of the photodiode would be metalized to facilitate soldering it to a base in the optoelectronic package at a position suitable for sensing the laser emissions.

Referring now to FIGS. 5 through 8, the steps of an exemplary dual beam laser diode assembly process can be seen. For example, in FIG. 5, a mounting structure including a base 102 and an electrical insulator 104 have a pair of contact pads 106 deposited thereon. The base may be any commonly employed base suitable for supporting the dual beam assembly, while insulator 104 is preferably a layer of silicon or beryllia suitable for conducting heat away from the heatsinks, yet maintaining electrical insulation from the base. Metal contact pads 106 are provided to enable the soldering of heatsinks thereto and to provide separate electrical contact to each laser.

Figure 6:
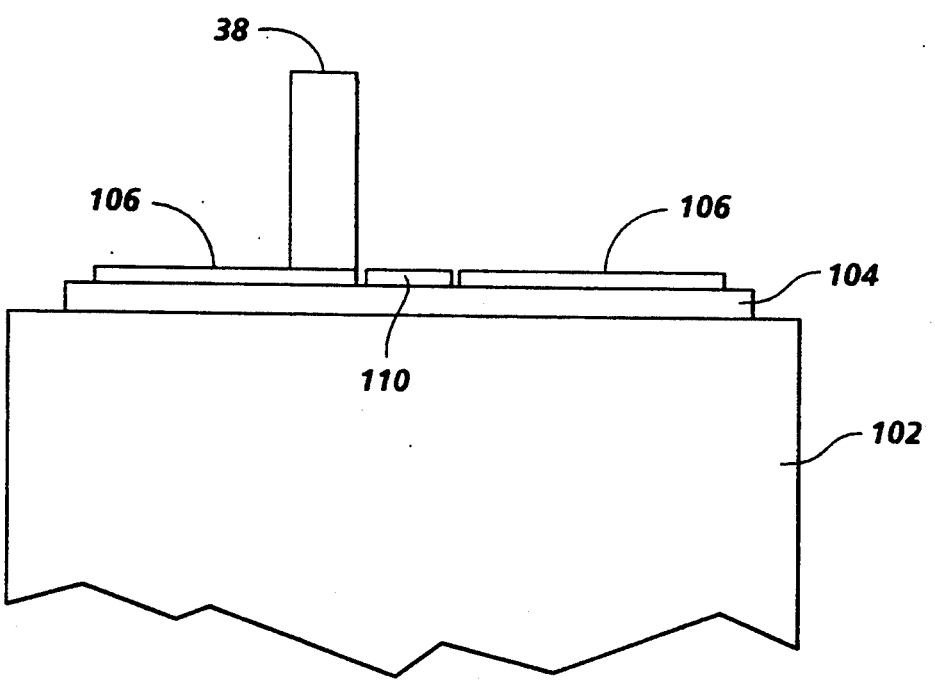

Next, as FIG. 6 illustrates, first heatsink 38 is soldered or brazed to a contact pad 106 on the base plate assembly using a high temperature solder such as gold-tin or silver-tin. Also attached to the base plate assembly at this point is photodiode 110 which will be used to detect the respective emission of light from the back side of ridge guide laser dies 22 and 24, previously described with respect to FIG. 1.

Figure 7:
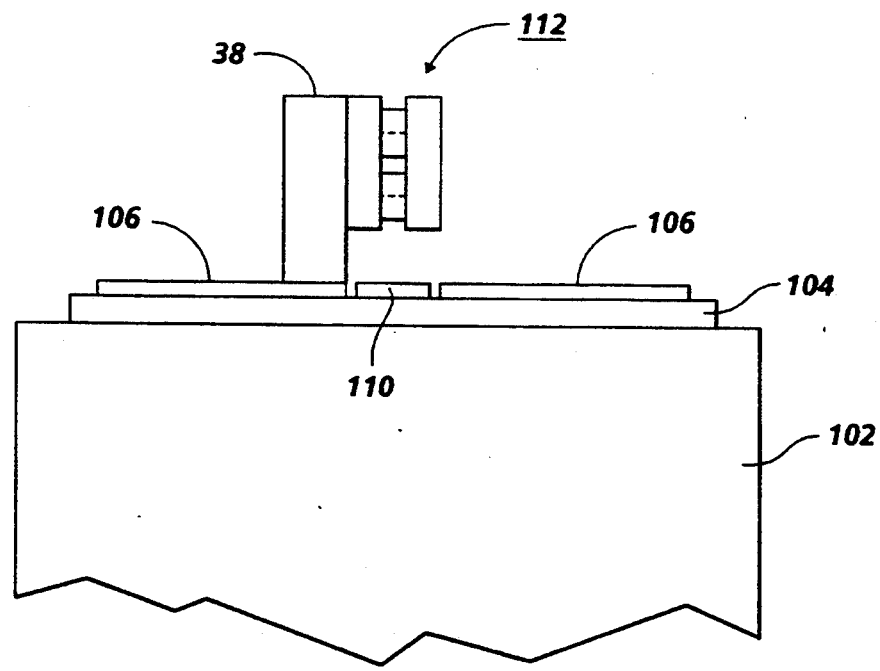

Subsequently, as illustrated by FIG. 7, dual beam laser assembly 112 is bonded to the first heatsink, preferably by a soldering process using an intermediate melting temperature solder such as high lead content lead-indium solder. Alternatively, as previously described with respect to FIG. 4, the lasers could be assembled at this point by bonding one laser die to the heatsink and then bonding the second laser die to the first so that the interlocking pads align the two laser dies. Hereagain, the solders used at the various bonding steps would have to be compatible (i.e., progressively lower in melting point) so as not to cause a deformation of a prior solder joint during a soldering operation. It may also be advantageous to make a common electrical connection to laser diode assembly 112 at this point, where greater access is available prior to addition of a second heatsink.

Figure 8:
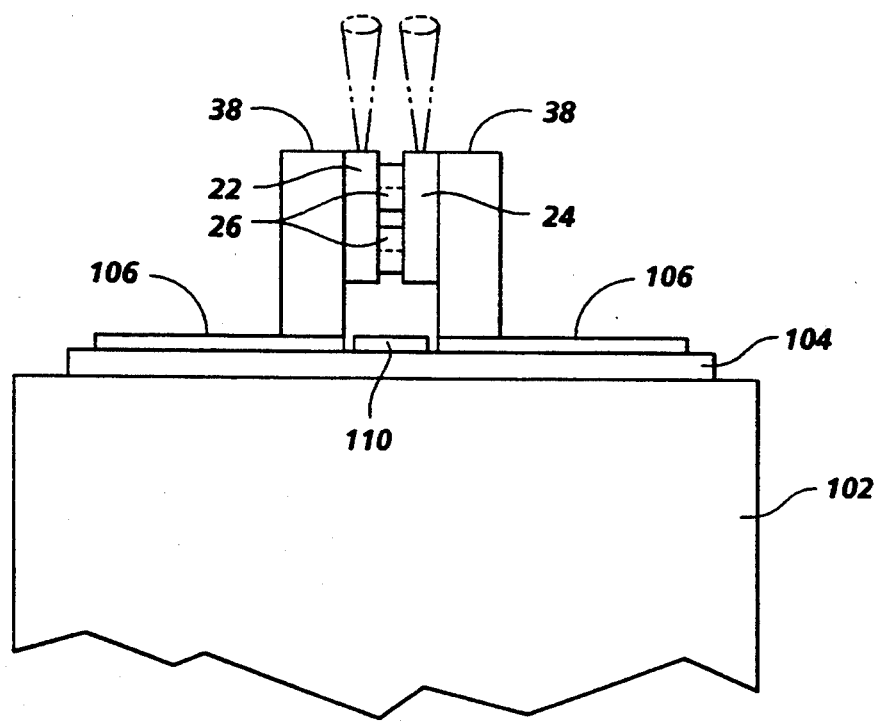

As FIG. 8 shows, the next step in the assembly process is the addition of the second heatsink, 38, to abut both the exposed laser die substrate surface and the contact pad simultaneously. Once again, the heatsink would be permanently affixed using a low temperature solder such as indium at both the laser die—heatsink joint and the heatsink—contact pad joint. Then, the assembled dual beam laser package illustrated in FIG. 8 would be placed within an commonly known optoelectronic package and bonded thereto using a very low melting point solder such as indium-tin. As depicted in the planar view of FIG. 9, the dual beam laser assembly would be completed by forming the previously described electrical contacts to the components using wirebonds. Specifically, connections are established to the two laser dies via conductors 44, to a laser common contact via conductor 46, and to the photodiode via conductor 120, each of the conductors being connected to electrical feedthroughs (not shown) which are present in the optoelectronic package. As is common practice, the assembly would then be completed by sealing it beneath a window cap (not shown).

In recapitulation, the present invention includes a method and apparatus for fabricating a dual beam semiconductor laser, wherein the laser includes first and second semiconductor laser dies respectively affixed to one another by intervening alignment members or structures. The alignment members not only provide accurate placement of the dual laser beams with respect to one another, but thermal and electrical isolation of the laser dies as well. The fabrication method employs photolithographic techniques to accurately position the alignment members across an entire semiconductor wafer prior to separation of the individual dies, thereby assuring accuracy in alignment of the assembled dual beam lasers. As a result of the alignment accuracy, the need for multiple-step alignment operations commonly employed in the production of multiple diode laser devices is eliminated.

It is, therefore, apparent that there has been provided, in accordance with the present invention, a method and apparatus for accurately positioning a pair of laser dies in a back-to-back relationship with the junction sides thereof facing each other to produce a closely spaced, dual beam laser diode. While this invention has been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of the appended claims.

I claim:

1. A dual beam laser diode, comprising:
    a first laser die including a light emitting region;
    a second laser die including a light emitting region; and
    means, interposed between said first laser die and said second laser die, for spacing said first laser die from said second laser die and aligning the respective light emitting regions thereof, said spacing means including a first alignment member mounted on a surface of said first laser die, and a second alignment member, complimentary to said first alignment member, mounted on a surface of said second laser die so that said first alignment member mates with said second alignment member to space opposed surfaces of said first laser die and said second laser die from one another and align the light emitting region of said first laser die and the light emitting region of said second laser die.

2. The dual beam laser diode of claim 1 wherein:
    first laser die comprises multiple epitaxial layers including a planar semiconductor substrate surface and a planar p-n junction surface, said first alignment member being located on the p-n junction surface of said first laser die; and
    said second laser die comprises multiple epitaxial layers including a planar semiconductor substrate surface and a planar p-n junction surface, said second alignment member being located on the p-n junction surface of said second laser die, said first laser die and said second laser die being assembled to one another with the respective p-n junction surfaces opposed from one another and spaced apart.

3. The dual beam laser diode of claim 2 further comprising:
    a first heatsink affixed to the substrate surface of the first laser die; and
    a second heatsink affixed to the substrate surface of the second laser die.

4. The dual beam laser diode of claim 1 wherein:
    said first alignment member comprises a portion thereof formed in a predefined shape; and
    said second alignment member comprises a portion thereof formed in a shape complimentary to the predefined shape of said portion of said first alignment member with said portion of said first alignment member contacting said portion of said second alignment member to accurately control the position of the light emitting regions of said first laser die with respect to said second laser die.

5. The dual beam laser diode of claim 4, wherein the predefined shape of said first alignment member is triangular.

6. A dual beam laser diode prepared by a process comprising the steps of:
    producing a plurality of laser dies on a semiconductor wafer, said laser dies each including a p-n junction lying beneath a first surface of the wafer and above a substrate layer which establishes a second surface, and a first metal layer on the first surface of the wafer, thereby providing electrical contacts for the laser dies;
    depositing a spacer material layer over the first metal layer present on the first surface of the wafer;
    selectively removing portions of the spacer material so as to produce complimentary alignment structures on the first surface of each laser die;
    depositing a second metal layer so as to metalize the surfaces of the alignment structures present on the first surface;
    dividing the semiconductor wafer into individual laser dies; and
    assembling a first die and a second die from said wafer, with the first surfaces of both dies spaced apart from one another by the complimentary alignment structures, so that the alignment structures on the first die mate with complimentary alignment structures on the second die, thereby aligning the dual beam semiconductor laser.

* * * * *